(12) United States Patent
Maeno et al.

(10) Patent No.: US 6,885,097 B2
(45) Date of Patent: Apr. 26, 2005

(54) SEMICONDUCTOR DEVICE (75) Inventors: Kazuhiro Maeno, Aichi-ken (JP); Eiji Kono, Aichi-ken (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 0 days.

(21) Appl. No.: 10/019,201

(22) PCT Filed: Apr. 24, 2001

(86) PCT No.: PCT/JP01/03524

§ 371 (c)(1),
(2), (4) Date: Dec. 20, 2001

(87) PCT Pub. No.: WO01/82376

PCT Pub. Date: Nov. 1, 2001

(65) Prior Publication Data

US 2002/0158327 A1 Oct. 31, 2002

(30) Foreign Application Priority Data

Apr. 25, 2000 (JP) ........................................ 2000-124447

(51) Int. Cl.$^7$ ........................... H01L 23/04; H05K 5/02; H05K 7/18
(52) U.S. Cl. ....................... 257/698; 257/690; 257/691; 257/692; 257/720; 257/723; 257/784; 361/813; 361/820; 361/832; 361/829
(58) Field of Search .............................. 257/698, 720, 257/712, 723, 690–692, 724, 784, 107, 213; 361/813, 820, 832, 829, 781, 783, 775, 736, 752, 753

(56) References Cited

U.S. PATENT DOCUMENTS

| | | | |
|---|---|---|---|
| 3,735,057 A | * 5/1973 | Bryan | ........................ 340/2.29 |
| 5,086,337 A | * 2/1992 | Noro et al. | .................. 257/726 |
| 5,444,295 A | 8/1995 | Lake et al. | .................. 257/678 |
| 5,495,889 A | * 3/1996 | Dubelloy | ............... 165/104.33 |
| 5,646,445 A | * 7/1997 | Masumoto et al. | ......... 257/723 |
| 5,761,040 A | * 6/1998 | Iwasa et al. | ................. 361/704 |
| 5,926,372 A | * 7/1999 | Rinehart et al. | ............ 361/704 |
| 6,060,772 A | 5/2000 | Sugawara et al. | .......... 257/678 |
| 6,215,679 B1 | * 4/2001 | Yamane et al. | ............. 363/132 |
| 6,272,015 B1 | * 8/2001 | Mangtani | ..................... 361/707 |
| 6,297,549 B1 | * 10/2001 | Hiyoshi | ...................... 257/703 |
| 6,353,258 B1 | * 3/2002 | Inoue et al. | ................. 257/723 |
| 6,417,532 B1 | * 7/2002 | Tsunoda et al. | ............ 257/219 |

FOREIGN PATENT DOCUMENTS

| | | |
|---|---|---|
| DE | 299 21 937 | 3/2000 |
| JP | A-6-085126 | 3/1994 |
| JP | A-6-283639 | 10/1994 |
| JP | 06283639 A | * 10/1994 |
| JP | A-07-58272 | 3/1995 |
| JP | A-8-306858 | 11/1996 |
| JP | A-10-41460 | 2/1998 |
| JP | 2001237369 A | * 8/2001 |

* cited by examiner

Primary Examiner—George Eckert
Assistant Examiner—Chris C. Chu
(74) Attorney, Agent, or Firm—Woodcock Washburn LLP (57) ABSTRACT

A board-shaped thermal conductor base board (3) is arranged on the bottom surface of a power module (1). Substrates (4) and (5) are arranged on the top surface of the thermal conductor base board (3), and semiconductor elements (6) and (7) are respectively arranged on the top surfaces of the substrates (4) and (5). The semiconductor elements (6, 7) are surrounded by a resinous case (2). A source electrode (13) is attached above and apart from the semiconductor elements (6, 7) by using the resinous case (2). The connection between the source electrode (13) and the sources of the semiconductor elements (7) are connected by wire bonding.

10 Claims, 9 Drawing Sheets

PRIOR ART

F I G. 1

PRIOR ART

SEMICONDUCTOR DEVICE

TECHNICAL FIELD

The present invention relates to a semiconductor device including a plurality of transistors, and more particularly, to an internal wiring structure of the semiconductor device.

BACKGROUND ART

These days, there is an increasing demand for a semiconductor device as a power module, which includes a plurality of semiconductor elements generating large amount of heat and is configured with a smaller body, on a trend of downsizing electronic appliances.

An existing semiconductor device (power module) is explained below with reference to FIGS. 1 and 2. A power module 51 includes a plurality of semiconductor elements. Additionally, a thermal conductor base board 52, which is shaped like a board with a ceramic material that is light in weight and has a good thermal conductivity, is attached to the bottom of the power module 51 as a thermal conductor member.

Substrates 55 and 56 are arranged on the top surface of the thermal conductor base board 52. The substrate 55 is configured by a conductor layer 55a and an insulator layer 55b, and the insulator layer 55b contacts with the thermal conductor base board 52. In the meantime, the substrate 56 is configured by a conductor layer 56a and an insulator layer 56b, and the insulator layer 56b contacts with the thermal conductor base board 52. A plurality of semiconductor elements 57 are arranged on the top surface of the conductor layer 55a, whereas a plurality of semiconductor elements 58 are arranged on the top surface of the conductor layer 56a. Here, the semiconductor elements 57 and 58 are MOSFETs, respectively. Additionally, the drain of the MOSFET is formed on one side of each of the semiconductor elements 57 and 58, whereas the source and the gate of the MOSFET are formed on the other side. The drain of each of the semiconductor elements 57 is in contact with the conductor layer 55a of the substrate 55, whereas the drain of each of the semiconductor elements 58 is in contact with the conductor layer 56a of the substrate 56.

A substrate 53 is arranged in the central region of the top surface of the thermal conductor base board 52. The substrate 53 is configured by a conductor layer 53a and an insulator layer 53b, and the insulator layer 53b contacts with the thermal conductor base board 52. Additionally, a source-drain electrode 54 is connected to the conductor layer 53a.

The substrates 55, 56, and 53 (and the semiconductor elements 57 and 58) are surrounded by a resinous case 59. A drain electrode 60, a source electrode 61, and gate electrodes 62 and 63 are attached to the resinous case 59. Additionally, the resinous case 59 is fixed to the thermal conductor base board 52.

Figure 1:
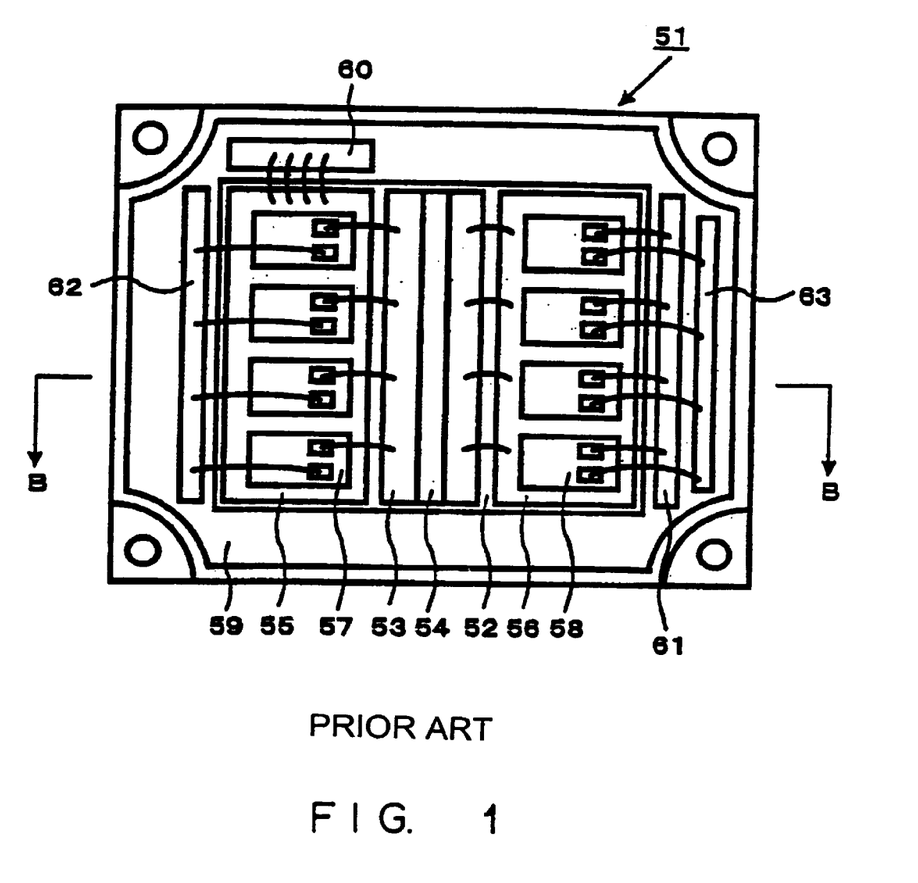
FIG. 1 is the top view of the inside of an existing semiconductor device.
Figure 2:
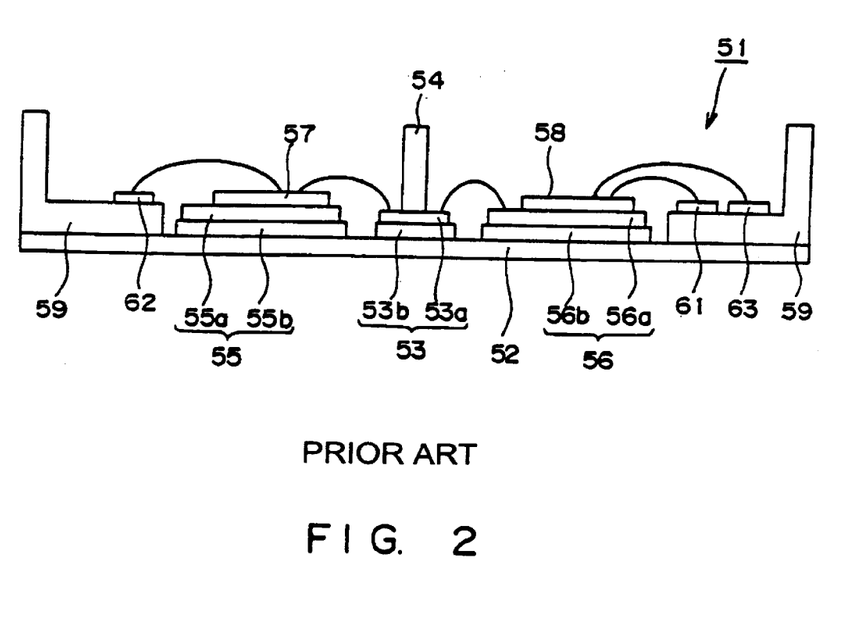
FIG. 2 is the B—B sectional view of the semiconductor device shown in FIG. 1.

Furthermore, as shown in FIG. 1 or FIG. 2, the connection between the drain electrode 60 and the conductor layer 55a of the substrate 55, the connection between the source of each of the semiconductor elements 57 and the conductor layer 53a of the substrate 53, the connection between the conductor layer 53a and the conductor layer 56a of the substrate 56, the connection between the source of each of the semiconductor elements 58 and the source electrode 61, the connection between the gate of each of the semiconductor elements 57 and the gate electrode 62, and the connection between the gate of each of the semiconductor elements 58 and the gate electrode 63 are respectively made by wire bonding.

If the substrates 53, 55, and 56, which occupy the most of the top region of the power module 51, are formed to be small in the semiconductor device having the above described configuration, a power module of a smaller size can be manufactured. However, the region required for wire bonding, and the region for arranging the source-drain electrode 54 must be secured for the substrate 53. Additionally, to implement the large capacity of the power module 51, the numbers of semiconductor elements 57 and 58 must be increased, which also requires the substrates 55 and 56 to be formed larger than a predetermined size. Accordingly, there are limits to the downsizing of the substrates 53, 55, and 56. Namely, it is not easy to reduce the size of a semiconductor device, such as a power module, etc.

DISCLOSURE OF INVENTION

The present invention was developed in view of the above described problems, and aims at providing a semiconductor device that comprises a plurality of semiconductor elements, and is configured as a small body.

The semiconductor device according to the present invention comprises a plurality of semiconductor elements arranged on a substrate, and a main current electrode which is arranged near said plurality of semiconductor elements and vertically apart from the surface of the substrate, wherein each of the semiconductor elements and the main current electrode are electrically connected. With this configuration, the semiconductor elements and the main current electrode are arranged in overlapping positions, thereby reducing the size of the semiconductor device.

In the above described semiconductor device, each of the semiconductor elements and the main current electrode may be connected by wires. With this configuration, conductors are hardly separated by heat cycle repetition.

Additionally, the semiconductor elements may be switching elements in the above described configuration. With this configuration, a circuit that performs switching operations with the semiconductor device can be configured.

Furthermore, in the above describe configuration, the semiconductor device may comprise a thermal conductor at its bottom, and the semiconductor elements may be thermally connected to the thermal conductor. With this configuration, heat generated from the semiconductor elements is radiated externally to the semiconductor device via the thermal conductor.

Still further, in the above described configuration, the thermal conductor may be formed with a ceramic material. With this configuration, the semiconductor device can be reduced in weight.

A semiconductor device according to another feature of the present invention is a semiconductor device including one or a plurality of semiconductor elements. This device comprises: a substrate on which the semiconductor elements are arranged; a case that is arranged in a predetermined position relative to the substrate so that the semiconductor elements are surrounded; and a metal member on which a main current electrode of the semiconductor elements and a terminal for electrically connecting this semiconductor device and a circuit external to this semiconductor device are formed integrally, wherein the metal member is arranged apart from the substrate by using the above described case. This configuration eliminates the need for operations connecting the electrode and the terminal, thereby simplifying the manufacturing process of the semi conductor device.

BEST MODE FOR CARRYING OUT THE INVENTION

Hereinafter, embodiments according to the present invention are explained with reference to the drawings. A semiconductor device according to the embodiment is a power module including a plurality of semiconductor elements.

Figure 3:
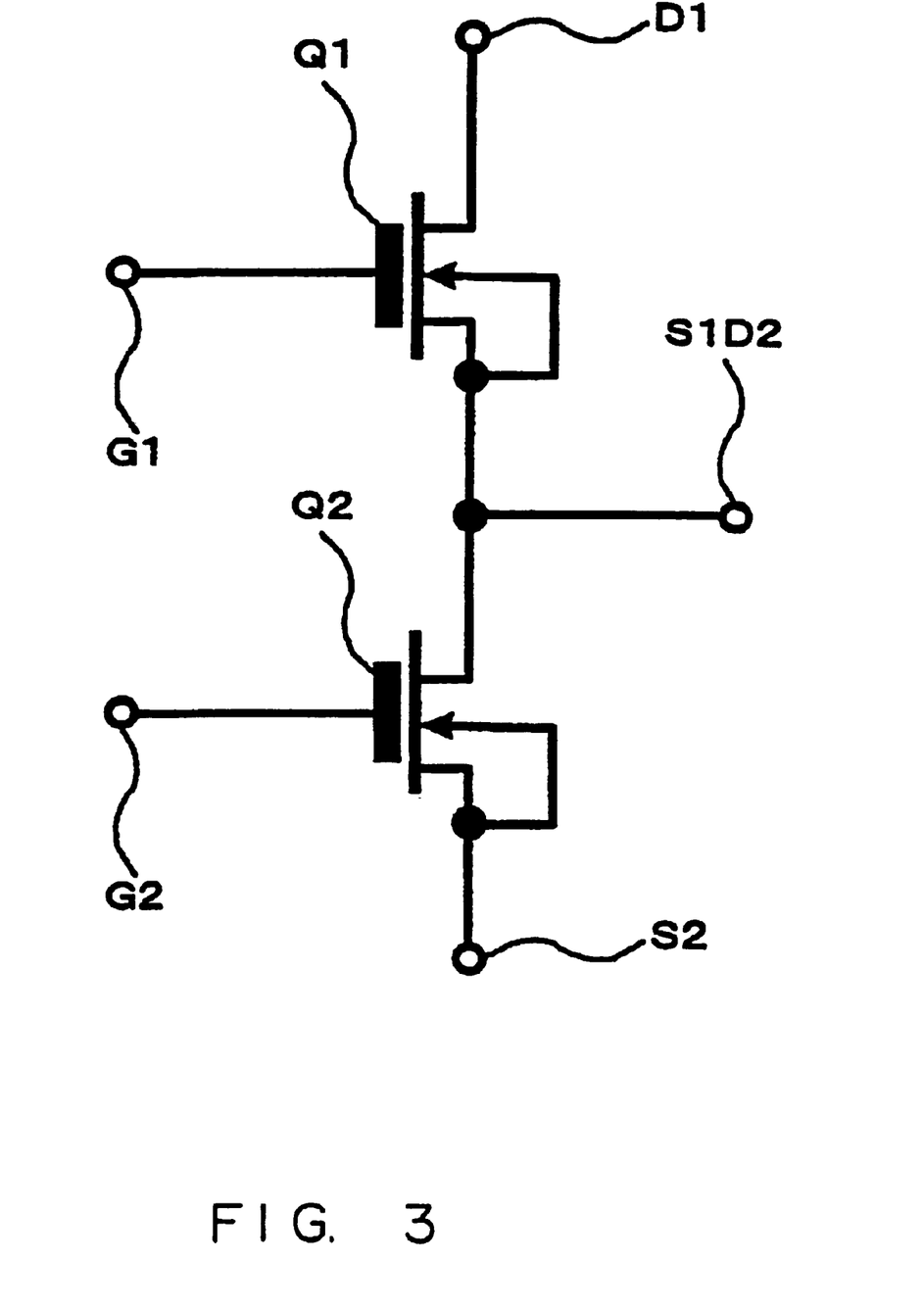
FIG. 3 shows a circuit formed within a semiconductor device according to an embodiment.

FIG. 3 shows the circuit formed within the semiconductor device according to this embodiment. The circuit shown in FIG. 3 is configured by a pair of transistors Q1 and Q2, which are connected in series. Hereinafter, the drain of the transistor Q1 is referred to as a drain D1, the gate of the transistor Q1 is referred to as a first gate G1, the gate of the transistor Q2 is referred to as a second gate G2, the source of the transistor Q2 is referred to as a source S2, and the connection point between the transistors Q1 and Q2 is referred to as a source-drain S1D2. The transistors Q1 and Q2 are respectively configured by a plurality of MOSFETs, which are connected in parallel.

If the transistors Q1 and Q2 are respectively controlled to enter ON and OFF states in this circuit, a main current flows from the drain D1 to the source-drain S1D2 via the transistor Q1. Additionally, if the transistors Q1 and Q2 are respectively controlled to enter OFF and ON states, the main current flows from the source-drain S1D2 to the source S2 via the transistor Q2.

Figure 4:
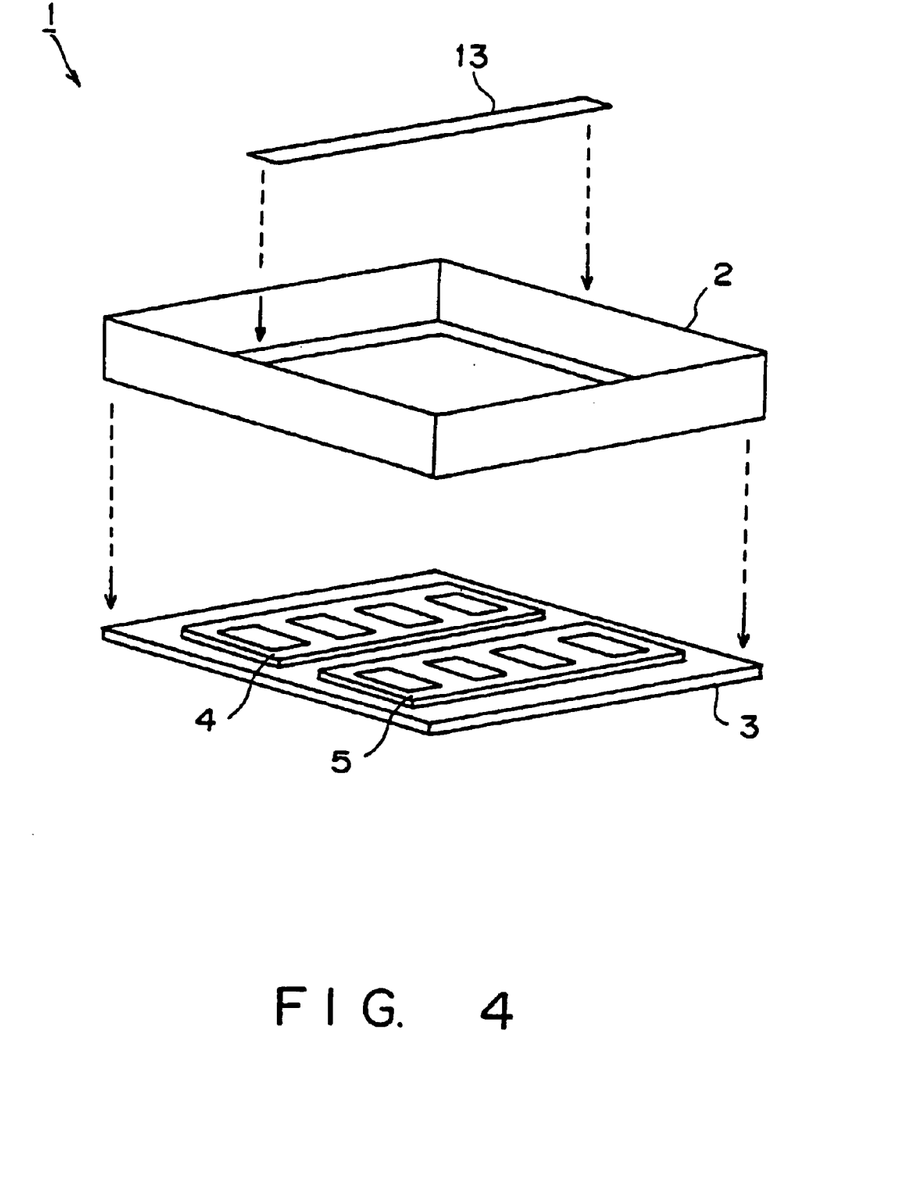
FIG. 4 shows the simplified configuration of the semiconductor device according to the embodiment.

FIG. 4 shows the simplified configuration of the semiconductor device according to the embodiment. A power module 1 as a semiconductor device is configured by substrates 4 and 5 on which a plurality of semiconductor elements are arranged, a resinous case 2 fixed to a thermal conductor base board 3 so as to surround the plurality of semiconductor elements, a source electrode 13 attached to the resinous case 2, and the like. The plurality of semiconductor elements that are arranged on the top surface of the substrates 4 and 5 are suitably connected, whereby the circuit shown in FIG. 3 is configured. Additionally, a source-drain electrode, a drain electrode, and a gate electrode, which are not shown in this figure, are arranged for the resinous case 2, and electrically connected to corresponding regions. Furthermore, the source electrode 13 is electrically connected to the source S2 shown in FIG. 2, which will be described in detail later.

Figure 5A:
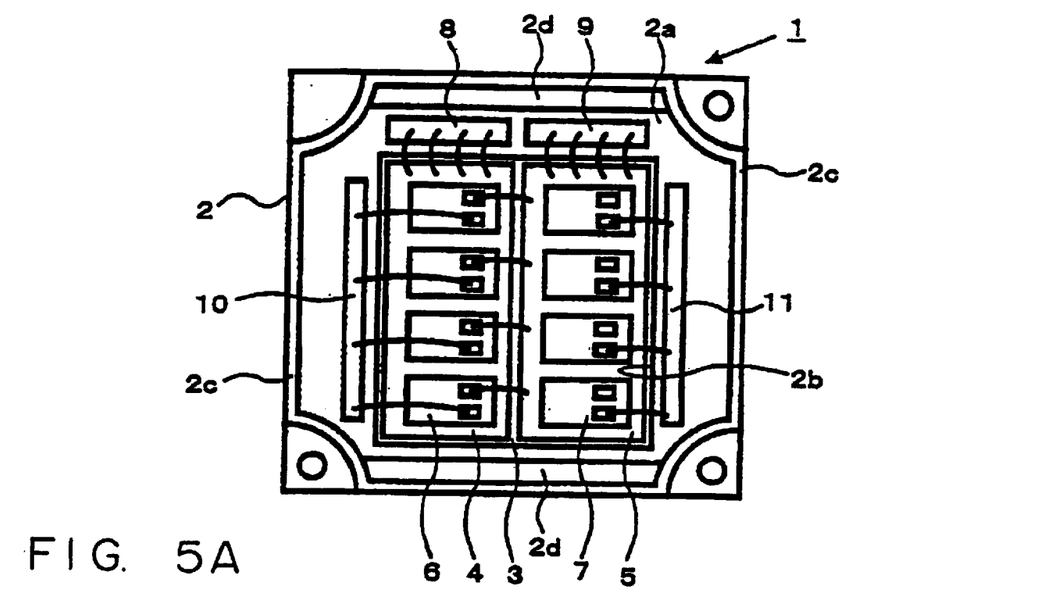
FIG. 5A is the top view of the inside of the semiconductor device in a state where a source electrode is not attached.

FIG. 5A is the top view of the inside of the power module 1 in a state where the source electrode 13 is not attached.

Figure 5B:
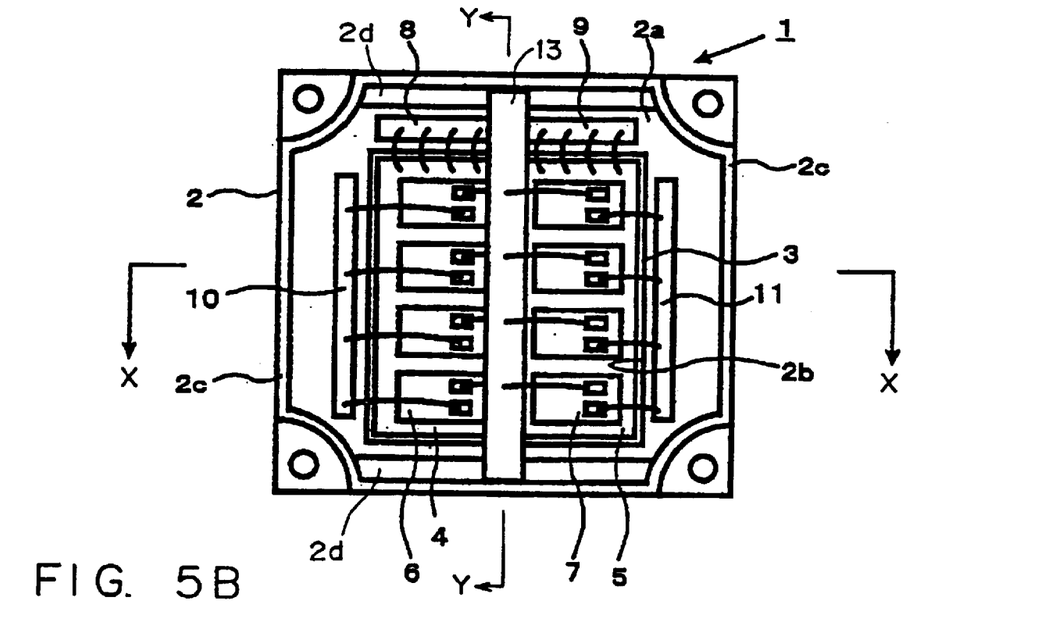
FIG. 5B is the top view of the inside of the semiconductor device in a state where the source electrode is attached.
Figure 6:
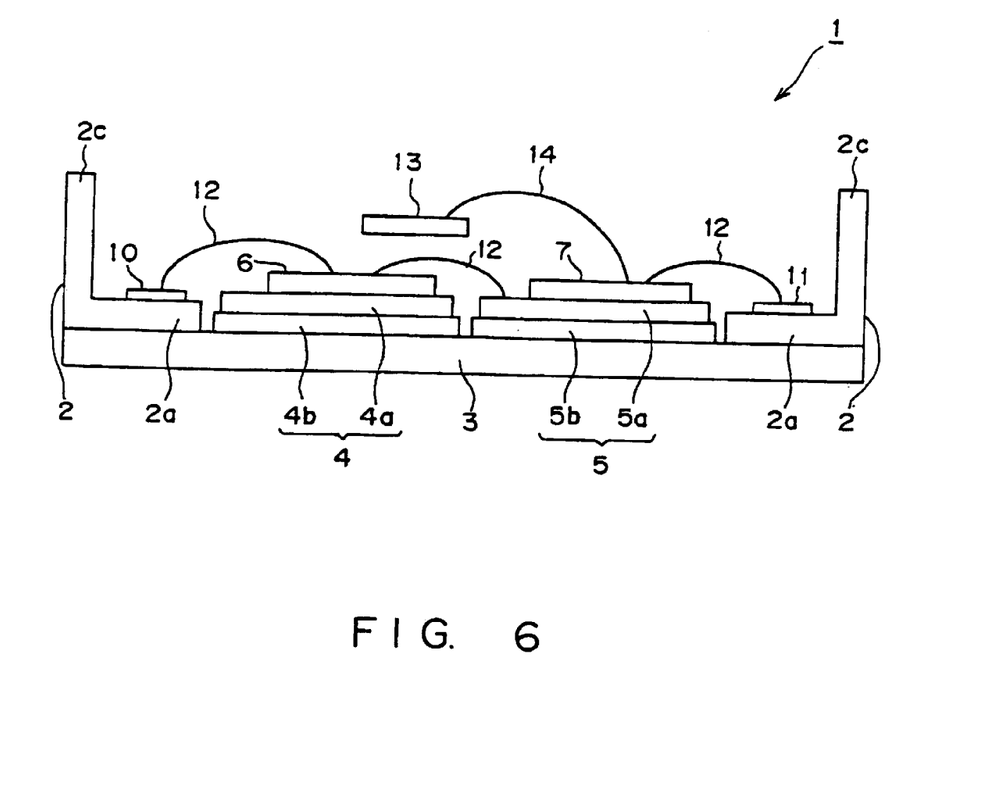
FIG. 6 is the X—X sectional view of the semiconductor device shown in FIG. 5B.
Figure 7:
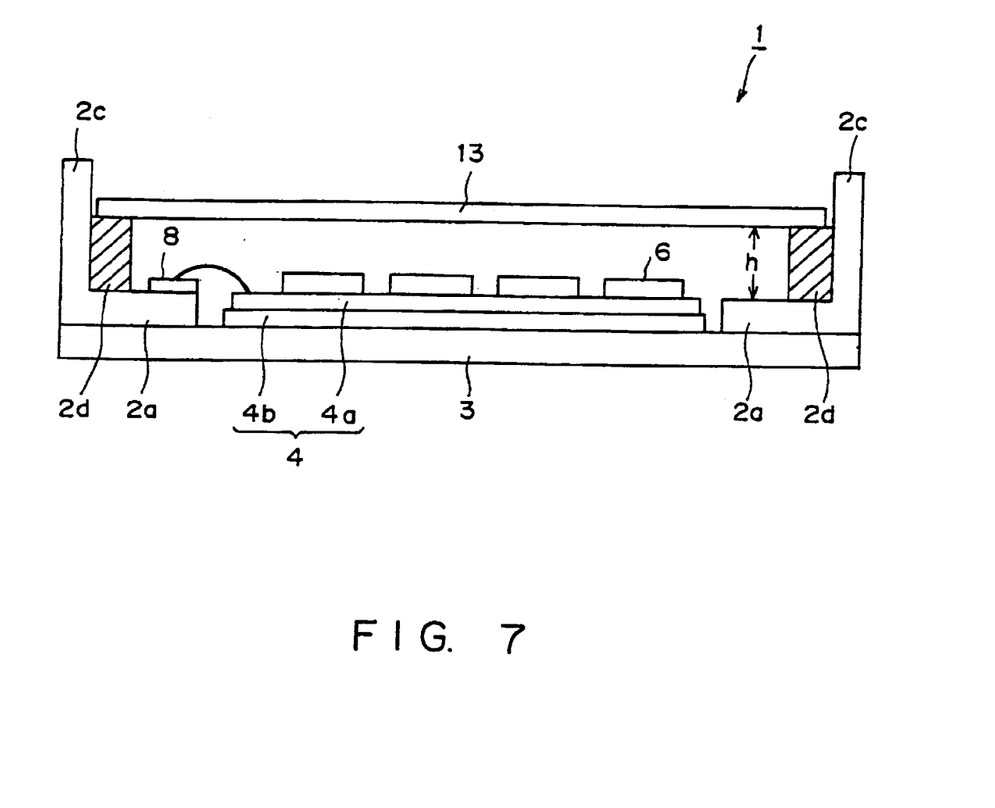
FIG. 7 is the Y—Y sectional view of the semiconductor device shown in FIG. 5B.

FIG. 5B is the top view of the inside of the power module 1 in a state where the source electrode 13 is attached. FIG. 6 is the X—X sectional view of the power module shown in FIG. 5. FIG. 7 is the Y—Y sectional view of the power module shown in FIG. 5B.

The thermal conductor base board 3 is, for example, a ceramic board with good thermal conductivity. This is a board on which a plurality of semiconductor elements are arranged, and radiates the heat generated by the semiconductor elements. For example, ceramic the composition of which is C—Al is available as the ceramic board. Furthermore, it is not always necessary that the thermal conductor base 3 board is ceramic, a metal plate such as a copper, an aluminum plate, etc. maybe available.

The substrates 4 and 5 are arranged in the central region on the top surface of the thermal conductor base board 3. The substrates 4 and 5 are respectively shaped into rectangular boards, and arranged in parallel so that their sides in the longitudinal direction are adjacent to each other. Here, the substrate 4 is configured by a conductor layer 4a, and an insulator layer 4b that electrically isolates the conductor layer 4a from the thermal conductor base board 3. In the meantime, the substrate 5 is configured by a conductor layer 5a and an insulator layer 5b that electrically isolates the conductor layer 5a from the thermal conductor base board 3.

On the surface of the conductor layer 4a, a plurality of semiconductor elements 6 are arranged in the longitudinal direction of the substrate 4. Here, four semiconductor elements 6 are arranged on the surface of the conductor layer 4a. The semiconductor element 6 is a semiconductor chip where MOSFET is formed. The source and the gate of a MOSFET are formed on the top surface of the semiconductor chip, whereas the drain of the MOSFET is formed on the bottom surface of the semiconductor chip. The drain of each of the semiconductor elements (MOSFETs) 6 is electrically connected to the conductor layer 4a. Similarly, four semiconductor elements 7 are arranged so that each drain of the semiconductor elements 7 are electrically connected to the conductor layer 5a on the top surface of the substrate 5 Note that the semiconductor elements 7 are the same MOSFETs as the semiconductor elements 6.

The resinous case 2 is a member which surrounds the substrates 4 and 5 (including the semiconductor elements 6 and 7) when being attached to the thermal conductor base board 3, and is configured by a bottom portion 2a, a frame portion 2c, and a pedestal portion 2d. The bottom portion 2a is a portion contacting with the thermal conductor base board 3, and the shape of its rim has almost the same as that of the rim of the thermal conductor base board 3. Furthermore, a hole 2b of a size which is slightly larger than the region for arranging the substrates 4 and 5 on the surface of the thermal conductor base board 3 is formed in the central region of the bottom portion 2a.

The frame portion 2c is formed to extend in the direction vertical to the bottom 2a along the rim of the bottom portion 2a. Namely, the frame portion 2c is positioned at the rim of the thermal conductor base board 3 when the resinous case 2 is attached to the thermal conductor base board 3. In the top view of the power module 1, the frame portion 2c is formed to be linear along the rim of the thermal conductor base 3 as shown in FIG. 5A or 5B, however, it is shaped like a circular arc, which centers each vertex of the bottom portion 2a, at each corner of the bottom portion 2a.

Figure 8:
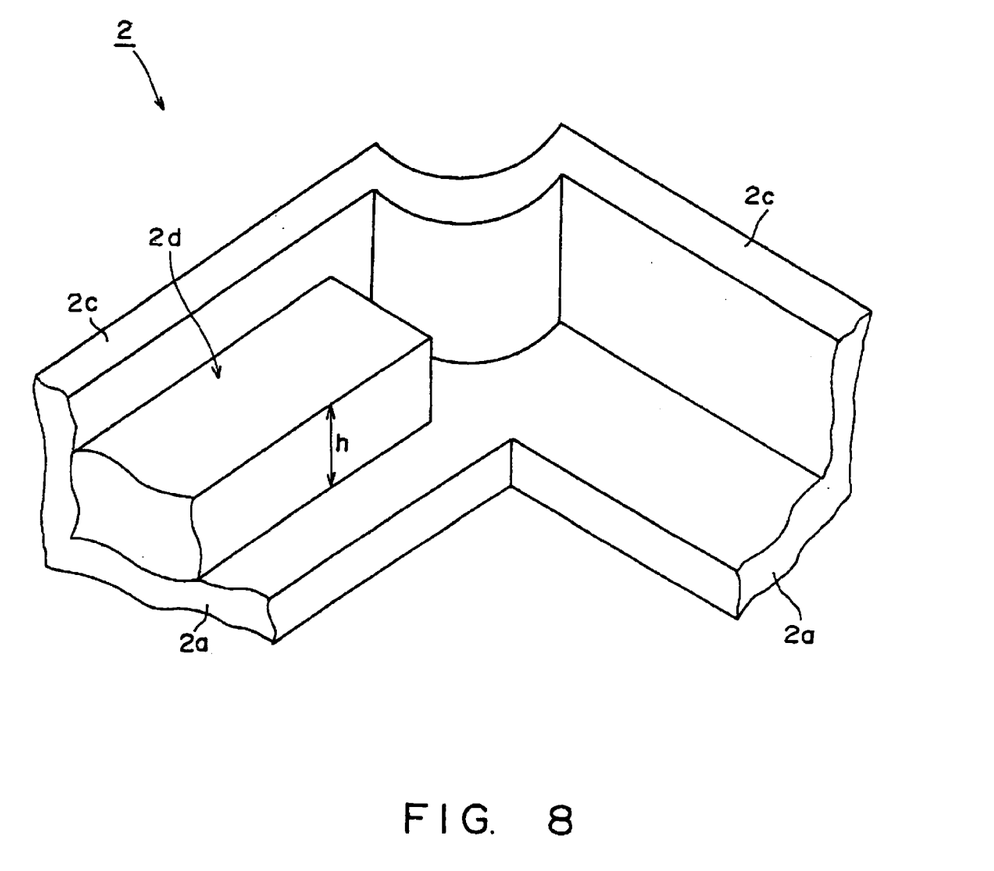
FIG. 8 shows part of a resinous case.

A pair of pedestal portions 2d are arranged in the positions that are opposed to each other along the interior wall of the frame portion 2c. Part of one example of the pedestal portion 2d is illustrated in FIG. 8. Additionally, the height h of the pedestal portions 2d is formed to be higher than those of the circuit components (the substrates 4 and 5, the semiconductor elements 6 and 7, etc.) when the resinous case 2 is attached to the thermal conductor base board 3 as shown in FIG. 7. Note that the pedestal portions 2d may be formed integrally with the bottom portion 2a and the frame portion 2c, or separately from the bottom portion 2a and the frame portion 2c.

The drain electrode 8 is arranged in a position adjacent to the substrate 4 on the top surface of the bottom portion 2a, whereas the source-drain electrode 9 is arranged in a position adjacent to the substrate 5 on the top surface of the bottom 2a. The drain electrode 8 and the source-drain electrode 9 are copper plates having the length equivalent to the length of the side of the substrates 4 and 5 in the lateral direction.

A first gate electrode 10 is arranged in a position in the longitudinal direction of the substrate 4 on the top surface of the bottom portion 2a. A second gate electrode it is arranged in a position in the longitudinal direction of the substrate 5 on the top surface of the bottom portion 2a. The first gate electrode 10 and the second gate electrode 11 are copper plates having the length equivalent to the length of the side of the substrates 4 and 5 in the longitudinal direction.

A source electrode 13 that is one of main current electrodes is, for example, a copperplate, and attached to a pair of the pedestal portions 2d as shown in FIG. 5B or FIG. 7. That is, the source electrode 13 bridges the pair of pedestal portions 2d. Here, the height h of the pedestal portions 2d is higher than those of the circuit components (the substrates 4 and 5, the semiconductor elements 6 and 7, etc.), which are arranged on the top surface of the thermal conductor base board 3. Accordingly, the source electrode 13 straddles the circuit components (the substrates 4 and 5, the semiconductor elements 6 and 7, etc.), which are arranged on the top surface of the thermal conductor base board 3. In other words, the circuit can be arranged in the region immediately below the source electrode 13. Here, the "circuit" includes a semiconductor element and a wiring pattern connected to the semiconductor element, the wiring pattern includes the conductor layers 4a and 5a. As a result, the region surrounded by the resinous case 2 on the top surface of the thermal conductor base board 3 can be effectively used.

Respective electrical connections between the semiconductor regions and the electrodes are as follows Namely, the connection between the drain electrode 8 and the conductor layer 4a of the substrate 4, the connection between the source of each of the semiconductor elements 6 and the conductor layer 5a of the substrate 5, the connection between the conductor layer 5a and the source-drain electrode 9, the connection between the gate of each of the semiconductor elements 6 and the first gate electrode 10, and the connection between the gate of each of the semiconductor elements 7 and the second gate electrode 11 are respectively made by wire bonding 12. Also, the connection between the source of each of the semiconductor elements 7 and the source electrode 13 is made by wire bonding 14.

The drain electrode 8 is connected to a drain terminal, that is not shown, for connecting the drain D1 of the power module 1 and an external circuit (a power supply, a load, or the like). Similarly, the source-drain electrode 9 is connected to a source-drain terminal, that is not shown, for connecting the source-drain S1D2 of the power module 1 and an external circuit. Furthermore, the source electrode 13 is connected to a source terminal, that is not shown, for connecting the source S2 of the power module 1 and an external circuit. In the meantime, the first gate electrode 10 is connected to a first gate terminal, that is not shown, for receiving a gate signal to control each of the semiconductor elements 6, whereas the second gate electrode 11 is connected to a second gate terminal, that is not shown, for receiving a gate signal to control each of the semiconductor elements 7.

The correspondence between the power module 1 shown in FIGS. 5 through 7 and the circuit shown in FIG. 3 is as follows. That is, the MOSFET formed in the semiconductor element 6 corresponds to the transistor Q1, whereas the MOSFET formed in the semiconductor element 7 corresponds to the transistor Q2. Additionally, the drain D1 corresponds to the drain electrode 8 (or the drain terminal not shown) of the power module 1, the source S2 corresponds to the source electrode 13 (or the source terminal not shown), and the source-drain S1D2 corresponds to the source-drain electrode 9 (or the source-drain terminal not shown). Furthermore, the gate G1 corresponds to the first gate electrode 10 (or the first gate terminal not shown) of the power module 1, whereas the gate G2 corresponds to the second gate electrode 11 (or the second gate terminal not shown).

The above described power module 1 is used, for example, as follows. That is, the drain D1 and the source S2 are respectively connected to the positive and the negative electrodes of a DC power supply. Additionally, the gates G1 and G2 are respectively connected to a control circuit for generating corresponding gate signals. Furthermore, a load to which power is to be supplied via this power module 1 is connected to the source-drain S1D2. When a predetermined control voltage is applied to the gate G1, the transistor Q1 enters an ON state (a path between the drain D1 and the source-drain S1D2 is conducting). In the meantime, when a predetermined control voltage is applied to the gate G2, the transistor Q2 enters an ON state (a path between the source-drain S1D2 and the source S2 is conducting). Accordingly, a predetermined control voltage is alternately applied to the gates G1 and G2, so that the transistors Q1 and Q2 enter the ON state in turn. As a result, an AC voltage according to the control voltage is supplied from the source-drain S1D2 to the load.

When the power supply and the load are connected to the power module 1, and the control voltage is supplied to the first gate electrode 10 and the second gate electrode 11, the current supplied to the load flows via the semiconductor elements 6 and 7, which generates heat. The heat generated by the semiconductor elements 6 and 7 at this time is conducted via the substrates 4 and 5 to the thermal conductor base 3, and radiated externally to the power module 1.

Figure 9:
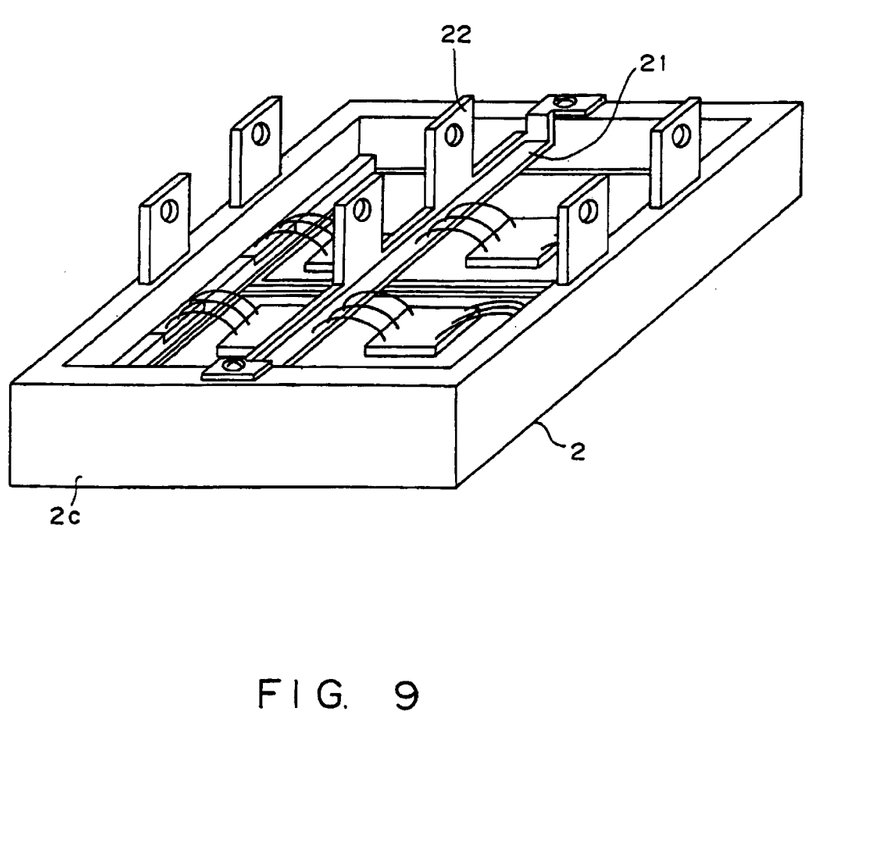
FIG. 9 is the perspective view of a semiconductor device according to another embodiment of the present invention.

FIG. 9 is the perspective view of a semiconductor device according to another embodiment of the present invention. The basic structure of the semiconductor device according to this embodiment is the same as that of the semiconductor device shown in FIGS. 4 through 8. In the semiconductor device shown in FIGS. 4 through 8, a pair of pedestal portions 2d are arranged along the interior wall of the resinous case 2, and the bridge electrode (the source electrode 13 in the embodiment) is fixed to the resinous case 2 with the pedestal portions 2d. In contrast, a bridge electrode is fixed to the resinous case 2 with the frame portion 2c in the semiconductor device according to this embodiment. To be more specific, the bridge electrode 21 is fixed to the frame portion 2c of the resinous case 2 with screws. Accordingly, since there is no need to arrange the pedestal portions 2d in the semiconductor device according to this embodiment, the inside space of the resinous case 2 is widened. In other words, the size of the module itself can be made smaller with the configuration according to this embodiment than that with the configuration shown in FIGS. 4 through 8 based on the assumption that the area of the regions in which semiconductor elements, etc. are arranged are identical.

Additionally, with the semiconductor device shown in FIG. 9, the bridge electrode 21 and an external terminal 22 are formed integrally with a single metal member. The bridge electrode 21 is a main current electrode for flowing the main current of semiconductor elements, and is, for example, a source electrode. Furthermore, the external terminal 22 is a terminal for connecting a circuit (including the semiconductor elements) formed within the semiconductor device and a circuit (including a power supply and a load) arranged outside the semiconductor device, and is, for example, a source terminal. Accordingly, there is no need for operations electrically connecting the bridge electrode and the external terminal in this semiconductor device, thereby simplifying the assembly process of the semiconductor device. To connect this semiconductor device to an external circuit, for example, a bus-bar, etc. is directly connected to the external terminal 22.

The semiconductor devices according to the above described embodiments have the following effects.

(1) The semiconductor device is configured without arranging a substrate for connecting a source-drain terminal on the top surface of the thermal conductor base board 3, thereby downsizing the body of the power module 1.

(2) The body of the power module 1 is downsized, and its internal current path is shortened, whereby the inductance within the device is decreased, and also an internal surge is reduced. Accordingly, a power module supporting a larger capacity can be configured.

(3) The size of the semiconductor device is made small, so that also the thermal conductor base board 3 formed with an expensive ceramic material can be downsized, which leads to a reduction in the parts cost for manufacturing the power module.

(4) The bridge electrode 21 and the external terminal 22 are formed integrally, whereby the external terminal can be arranged in a desired position, and the distance between a semiconductor element and the external terminal can be shortened. Additionally, the troublesomeness of the assembly operations of the semiconductor device can be saved.

(5) The bridge electrode is fixed to the frame portion 2c of the resinous case 2, which eliminates the need for arranging the pedestal portions 2d, leading to a wider internal space of the resinous case 2. In other words, the module can be further downsized.

The semiconductor device according to the present invention is not limited to the above described examples, and may have the following configurations.

(a) The pedestal portions 2d may be formed into an arbitrary shape as long as the size of the top surface required for fixing the source electrode 13 is secured.

(b) It is not always necessary to form the pedestal portions 2d integrally with the resinous case 2, and may be joined to a resinous case after being generated independently from the resinous case. In this case, the pedestal portions 2d may be formed with a material different from that of the resinous case.

(c) A semiconductor element is not limited to a configuration in which a MOSFET drain is formed on one side, and a source and a gate are formed on the other side. For example, the semiconductor element may be a configuration such that a drain, a source, and a gate are formed on one side of a semiconductor chip, and the connections between respective semiconductor regions and their corresponding electrodes are made by wire bonding. In this case, the substrates 4 and 5 can be configured only by an insulator layer.

(d) The number of semiconductor elements, which are connected in parallel, may be selected according to a desired power capacity.

(e) The semiconductor device is not limited to a circuit module composed of one pair of switching elements. The semiconductor device may be, for example, a circuit module configured by a group of four or six switching elements.

(f) The semiconductor device is not limited to a configuration such that a source electrode is arranged above the thermal conductor base board 3 to which the semiconductor elements 6 and 7 are provided, and may be a configuration such that either of the drain electrode and the source-drain electrode is arranged above the semiconductor elements. In this case, wiring within the semiconductor device can be selected according to the layout of the electrodes.

(g) The semiconductor device is not limited to a configuration such that only a source electrode is arranged above the thermal conductor base board 3 to which the semiconductor elements 6 and 7 are provided, and may be a configuration such that two or more of the source electrode, the drain electrode, and the source-drain electrode are arranged above the semiconductor elements. In this case, the body of the semiconductor device can be further downsized.

(h) The semiconductor elements are not limited to MOSFETs, and may be bipolar transistors or thyristors. In this case, the semiconductor device can be configured by using semiconductor elements according to circuit specifications. Furthermore, the semiconductor device may comprise a plurality kinds of semiconductor elements.

(i) The semiconductor device is not limited to a configuration such that the parts within the semiconductor device are connected by wire bonding, but may be a different configuration such as a configuration where wires are connected with soldering, a configuration where metal plates are joined and connected, or the like.

(j) A material of the thermal conductor base board as a thermal conductor member may be a ceramic with the composition other than C—Al. Additionally, the thermal conductor base board may be of a different material with high thermal conductivity, not limited to the material the composition of which is ceramic. For example, a metal material such as copper, aluminum, etc. can be cited as a material with high thermal conductivity.

(k) The thermal conductor member is not limited to a board shape. For instance, the thermal conductor member maybe of a shape comprising a fin that extends externally to the semiconductor device.

(l) The semiconductor device is not limited to a structure comprising the thermal conductor member, but may be a structure such that semiconductor elements are contacts with a resinous case without comprising a thermal conductor member. This structure is applicable to the case where the heat generated by semiconductor elements is small. With this configuration, a semiconductor device can be manufactured with less troublesome operations and at lower cost.

(m) Materials of the electrodes are not limited to copper.

(n) A case may be made from metal instead of resin. The electrodes may be attached to the metal case via an insulator member.

(o) It is not always necessary to form the bridge electrode into a straight shape, but an arbitrary shape. By way of example, the shape of the bridge electrode can be determined so that the distance between the bridge electrode and semiconductor elements becomes the shortest.

(p) The number of bridge electrodes is not limited to one. A plurality of bridge electrodes may be arranged for each semiconductor device.

(q) The case may be fixed not to the thermal conductor base board but to a substrate.

(r) It is not necessary to arrange semiconductor elements in one row or a plurality of rows. For example, the arrangement of semiconductor elements may be determined so that the wire distance between an electrode and a semiconductor element becomes the shortest according to the form of each electrode.

As described above in detail, a semiconductor device with a small size can be manufactured according to the present invention.

What is claimed is:

1. A semiconductor device comprising:

a plurality of semiconductor elements arranged on a substrate;

a main current electrode, which is formed by a piece of metal, arranged near said plurality of semiconductor elements and vertically apart from the surface of the substrate, and a case surrounding said plurality of semiconductor elements, wherein each of said plurality of semiconductor elements and said main current electrode are electrically connected, and wherein said main current electrode bridges from one end of the substrate to an opposite end of the substrate and is arranged immediately above one of said plurality of semiconductor elements or a wiring pattern connected to the one of said plurality of semiconductor elements, and wherein both ends of said main current electrode are supported by said case.

2. The semiconductor device according to claim 1, wherein each of said plurality of semiconductor elements and said main current electrode are connected by wire bonding.

3. The semiconductor device according to claim 1, wherein said plurality of semiconductor elements are switching elements.

4. the semiconductor device according to claim 1, further comprising a thermal conductor at a bottom of the semiconductor device, wherein said plurality of semiconductor elements are directly or indirectly connected to said thermal conductor member so that they are thermally coupled.

5. The semiconductor device according to claim 4, wherein said thermal conductor member is formed with a ceramic material.

6. The semiconductor device according to claim 1, wherein said plurality of semiconductor elements are arranged in one row or a plurality of rows.

7. A semiconductor device including one or a plurality of semiconductor elements, comprising:

a substrate on which the one or the plurality of semiconductor elements are arranged;

a case that is arranged in a predetermined position relative to said substrate so that one of the plurality of semiconductor elements are surrounded; and a metal member on which a main current electrode of the one of the plurality of semiconductor elements and a terminal for electrically connecting said semiconductor device and a circuit external to said semiconductor device are formed integrally, wherein said metal member is arranged in a position apart from said substrate by using said case without directly contacting said substrate, and wherein said metal member bridges from one end of the substrate to an opposite end of the substrate.

8. The semiconductor device according to claim 7, wherein said metal member is arranged above the one of the plurality of semiconductor elements or a wiring pattern connected to the one of the plurality of semiconductor elements.

9. The semiconductor device according to claim 7, wherein said metal member and the semiconductor device are electrically connected by wire bonding.

10. The semiconductor device according to claim 7, wherein:

said case includes a frame portion surrounding the one of the plurality of semiconductor elements; and said metal member is fixed to the frame portion of said case.

* * * * *